US007842341B2

(12) United States Patent
Boroson et al.

(10) Patent No.: US 7,842,341 B2
(45) Date of Patent: Nov. 30, 2010

(54) PURIFYING ORGANIC MATERIALS FOR PHYSICAL VAPOR DEPOSITION

(75) Inventors: Michael L. Boroson, Rochester, NY (US); Ronald S. Cok, Rochester, NY (US); Michael Long, Hilton, NY (US); Dennis R. Freeman, Spencerport, NY (US); Jeremy M. Grace, Penfield, NY (US)

(73) Assignee: Global OLED Technology LLC, Wilmington, DE (US)

( * ) Notice: Subject to any disclaimer, the term of this patent is extended or adjusted under 35 U.S.C. 154(b) by 1157 days.

(21) Appl. No.: 11/272,320

(22) Filed: Nov. 10, 2005

(65) Prior Publication Data

US 2007/0104890 A1    May 10, 2007

(51) Int. Cl.
*C23C 16/00* (2006.01)
*B05D 3/06* (2006.01)

(52) U.S. Cl. .................. 427/248.1; 427/8; 427/58; 427/66; 427/557; 427/593

(58) Field of Classification Search ................ 427/557, 427/593
See application file for complete search history.

(56) References Cited

U.S. PATENT DOCUMENTS

| 2,447,789 | A |   | 8/1948  | Barr            |
|-----------|---|---|---------|-----------------|
| 4,356,429 | A |   | 10/1982 | Tang            |
| 4,539,507 | A |   | 9/1985  | VanSlyke et al. |
| 4,720,432 | A |   | 1/1988  | VanSlyke et al. |
| 4,769,292 | A |   | 9/1988  | Tang et al.     |
| 5,290,648 | A | * | 3/1994  | Kim et al. ....................... 430/28 |
| 6,797,314 | B2 | * | 9/2004 | Van Slyke et al. ............. 427/66 |
| 2002/0090877 | A1 | * | 7/2002 | Minami et al. ................. 445/6 |
| 2003/0107633 | A1 | * | 6/2003 | Sato et al. .................... 347/103 |
| 2003/0136714 | A1 | * | 7/2003 | Lu et al. ........................ 210/90 |
| 2005/0127827 | A1 | * | 6/2005 | Hiraoka et al. .............. 313/504 |
| 2006/0289289 | A1 | * | 12/2006 | Kloc ........................... 203/71 |

FOREIGN PATENT DOCUMENTS

EP          0 982 411         3/2000
EP          1 156 536 A2  *  11/2001

* cited by examiner

*Primary Examiner*—Shamim Ahmed
(74) *Attorney, Agent, or Firm*—Morgan Lewis & Bockius LLP

(57) ABSTRACT

A method for evaporating a plurality of purified organic materials in a thermal physical vapor deposition system, comprising the steps of: mixing predetermined amounts of first and second organic materials to form a mixture of materials at a predetermined ratio; processing at least one of the organic materials at less than the sublimation temperature of the at least one of the organic materials before or after mixing to remove a first contaminant, wherein if processing is after mixing, the processing temperature is lower than the sublimation temperature of each of the organic materials; providing a thermal physical vapor deposition source; transferring the purified mixture of organic materials into the thermal physical vapor deposition source while maintaining the purified mixture of organic materials in a controlled, contaminant-free environment; and using the source to evaporate the purified mixture of organic materials.

17 Claims, 11 Drawing Sheets

PURIFYING ORGANIC MATERIALS FOR PHYSICAL VAPOR DEPOSITION

CROSS REFERENCE TO RELATED APPLICATIONS

Reference is made to commonly assigned U.S. patent application Ser. No. 10/663,636 filed Sep. 19, 2003, entitled "Forming Homogeneous Mixtures of Organic Materials for Physical Vapor Deposition Using Melting" by Carlton et al; U.S. patent application Ser. No. 10/945,940 filed Sep. 21, 2004, entitled "Delivering Organic Powder to a Vaporization Zone" by Long et al; U.S. patent application Ser. No. 11/050,924 filed Feb. 4, 2005, entitled "Controllably Feeding Organic Material in Making OLEDS" by Long et al; U.S. patent application Ser. No. 11/134,654 filed May 20, 2005 entitled "Delivering Particulate Material to a Vaporization Zone" by Long et al; the disclosures of which are incorporated herein by reference.

FIELD OF THE INVENTION

The present invention relates to the field of physical vapor deposition of OLED materials, and more specifically to purifying the materials for use in a physical vapor deposition apparatus.

BACKGROUND OF THE INVENTION

An organic light-emitting diode (OLED), also referred to as an organic electroluminescent device, can be constructed by sandwiching two or more organic layers between first and second electrodes. The types of organic materials, thickness of vapor-deposited organic layers, and layer configurations useful in constructing an organic light-emitting device are described, for example, in commonly assigned U.S. Pat. Nos. 4,356,429; 4,539,507; 4,720,432; and 4,769,292, the disclosures of which are herein incorporated by reference.

Organic materials useful in making OLED displays, for example organic hole-transporting materials, organic light-emitting materials with an organic dopant, and organic electron-transporting materials, can have relatively complex molecular structures with relatively weak molecular bonding forces, so care must be taken to avoid decomposition of the organic material during synthesis, storage, transportation, and physical vapor deposition. The aforementioned organic materials are generally synthesized to a relatively high degree of purity, and are provided in the form of powders, flakes, or granules. It is known that providing and maintaining the organic materials in a state of relatively high purity is difficult.

Physical vapor deposition in a vacuum environment is the principal means of depositing thin organic material films as used in small molecule OLED devices. Such methods are well known, for example Barr in U.S. Pat. No. 2,447,789 and Tanabe et al. in EP 0 982 411. The organic materials used in the manufacture of OLED devices are often subject to degradation when maintained at or near the desired rate dependent vaporization temperature for extended periods of time. Exposure of sensitive organic materials to higher temperatures can cause changes in the structure of the molecules and associated changes in material properties.

To overcome the thermal sensitivity of these materials, only small quantities of organic materials have been loaded in sources and are heated as little as possible. In this manner, the material is consumed before it has reached the temperature exposure threshold to cause significant degradation. The limitations with this practice are that the available vaporization rate is very low due to the limitation on heater temperature, and the operation time of the source is very short due to the small quantity of material present in the source. In the prior art, it has been necessary to vent the deposition chamber, disassemble and clean the vapor source, refill the source, reestablish vacuum in the deposition chamber, and degas the newly-introduced organic material over several hours before resuming operation. The low deposition rate and the frequent and time consuming process associated with recharging a source has placed substantial limitations on the throughput of OLED manufacturing facilities.

A secondary consequence of heating the entire organic material charge to roughly the same temperature is that it is impractical to mix additional organic materials, such as dopants, with a host material unless the vaporization behavior and vapor pressure of the dopant is very close to that of the host material. This is generally not the case and as a result, prior art devices frequently require the use of separate sources to co-deposit host and dopant materials.

A consequence of using single component sources is that many sources are required in order to produce films containing a host and multiple dopants. These sources are arrayed adjacently with the outer sources angled toward the center to approximate a co-deposition condition. In practice, the number of such sources used to co-deposit different materials has been limited to three. This restriction has imposed a substantial limitation on the architecture of OLED devices. The requirement of many single component sources increases the necessary size and cost of the vacuum deposition chamber, increases the number of independent power supplies required to control the sources, and decreases the reliability of the system.

Additionally, the use of separate sources creates a gradient effect in the deposited film where the material in the source closest to an advancing substrate is over-represented in the initial film immediately adjacent the substrate while the material in the last source is over-represented in the final film surface. This gradient co-deposition is unavoidable in prior art sources where a single material is vaporized from each of multiple sources. The gradient in the deposited film is especially evident when the contribution of either of the end sources is more than a few percent of the central source, such as when a co-host is used. FIG. 1 shows a cross-sectional view of such a prior-art vaporization device 5, which includes three individual sources 6a, 6b, and 6c for vaporizing organic material. A vapor plume 9 is preferably homogeneous in the materials from the different sources, but in fact varies in composition from side to side, resulting in a non-homogeneous coating on a substrate 8.

A further limitation of prior art sources is that the geometry of the vapor manifold changes as the organic material charge is consumed, which requires that the heater temperature change to maintain a constant vaporization rate for a given organic material. It is observed that the overall plume shape of the vapor exiting the orifices can change with varying organic material thickness and distribution in the source.

For single component sources, the deposition rate determines the amount of vapor deposited on a substrate for a given length of time. In other words, the rate of vaporization of each individual deposition source is crucial because it determines the component ratio of the deposited organic layer on the substrate. Since the weight percentage of the dopant component in organic layers is lower than that of the host component, the deposition rate for the dopant component must be adjusted accordingly. If the rate of vaporization of individual sources is not precisely controlled, the component ratio of the deposited layer can vary significantly from the optimum for a given OLED display.

Powders, flakes, or granules typically have high surface to volume ratios, and a correspondingly high propensity to entrap air and/or moisture between particles. Consequently, a charge of organic powders, flakes, or granules loaded into a physical vapor deposition source within a chamber often must be thoroughly outgassed by preheating the source at reduced pressure once in the chamber. If outgassing is omitted or is incomplete, particulate can be ejected from the evaporation source during the physical vapor deposition process. An OLED, having multiple organic layers, can become inoperative if such layers include particles or particulates. Further, the aforementioned aspects of organic powders, flakes, or granules can lead to non-uniform heating of such organic materials in physical vapor deposition sources, causing spatially non-uniform vaporization of organic material. This can result in non-uniform layers on an OLED device. Moreover, undesired contaminants can be vapor-deposited on a structure. There is a need, therefore, for a method of purifying various organic materials employed in OLED devices, providing a plurality of organic materials in a purified state to a thermal physical vapor deposition system, and co-depositing the organic materials on a substrate.

SUMMARY OF THE INVENTION

It is therefore an object of the present invention to provide a method for supplying purified organic materials to a physical vapor evaporation system for depositing on organic layer on a structure to form a part of an OLED display.

This object is achieved by a method for evaporating a plurality of purified organic materials in a thermal physical vapor deposition system, comprising the steps of:

a) mixing predetermined amounts of first and second organic materials to form a mixture of materials at a predetermined ratio;

b) processing at least one of the organic materials at less than the sublimation temperature of the at least one of the organic materials before or after mixing to remove a first contaminant, wherein if processing is after mixing, the processing temperature is lower than the sublimation temperature of each of the organic materials;

c) providing a thermal physical vapor deposition source;

d) transferring the purified mixture of organic materials into the thermal physical vapor deposition source while maintaining the purified mixture of organic materials in a controlled, contaminant-free environment; and e) using the source to evaporate the purified mixture of organic materials.

It is an advantage of the present invention that it improves device performance through decrease in contamination from absorbed gases and other highly volatile contaminants.

It is a further advantage of the present invention that it allows for continuous coating operation without the need to stop for chamber venting, material loading, chamber evacuation, or outgassing material steps.

It is a further advantage of the present invention that the continuous heating of material during operation of prior art devices is eliminated in that only a small portion of organic material is heated, for a short period of time and at a controlled rate. The bulk of organic material is maintained at a temperature that can be as much as 300° C. cooler than the desired rate-dependent vaporization temperature.

It is a further advantage of the present invention that it can maintain a steady vaporization rate with a continuously replenished charge of organic material and with a steady heater temperature. The device thus allows extended operation of the source with substantially reduced risk of degrading even very temperature-sensitive organic materials.

It is a further advantage of the present invention that it permits materials having different vaporization rates and degradation temperature thresholds to be co-sublimed in the same source, reducing the number of sources and controllers, and reducing the volume of the coating chamber.

It is a further advantage of this invention that it can remove adsorbed gases or contaminants from the organic materials to be vaporized through the device.

It is a further advantage of the present invention that it permits linear vaporization rate control by controlling the volumetric metering rate or the feed pressure of the compacted organic material powder.

It is a further advantage of the present invention that it can rapidly stop and reinitiate vaporization and achieve a steady vaporization rate quickly by controlling the metering rate of the organic material, thereby minimizing contamination of the deposition chamber walls and conserving the organic materials when a substrate is not being coated.

It is a further advantage that the present device achieves substantially higher vaporization rates than in prior art devices with substantially reduced material degradation. Further still, no heater temperature change is required as the source material is consumed.

It is a further advantage of the present invention that it can provide a vapor source in any orientation, which is frequently not possible with prior-art devices.

The term "powder" is used herein to denote a quantity of individual particles, which can be flakes, granules, or mixtures of varied particles and shapes comprising single or plurality of molecular species.

DETAILED DESCRIPTION OF THE INVENTION

The organic layers of an OLED display include at least one organic or organo-metallic material that produces light, known as electroluminescence (EL), as a result of electronhole recombination in the layer. Hereinafter, the term "organic" will be taken to include both purely organic as well as organo-metallic materials.

Figure 1:
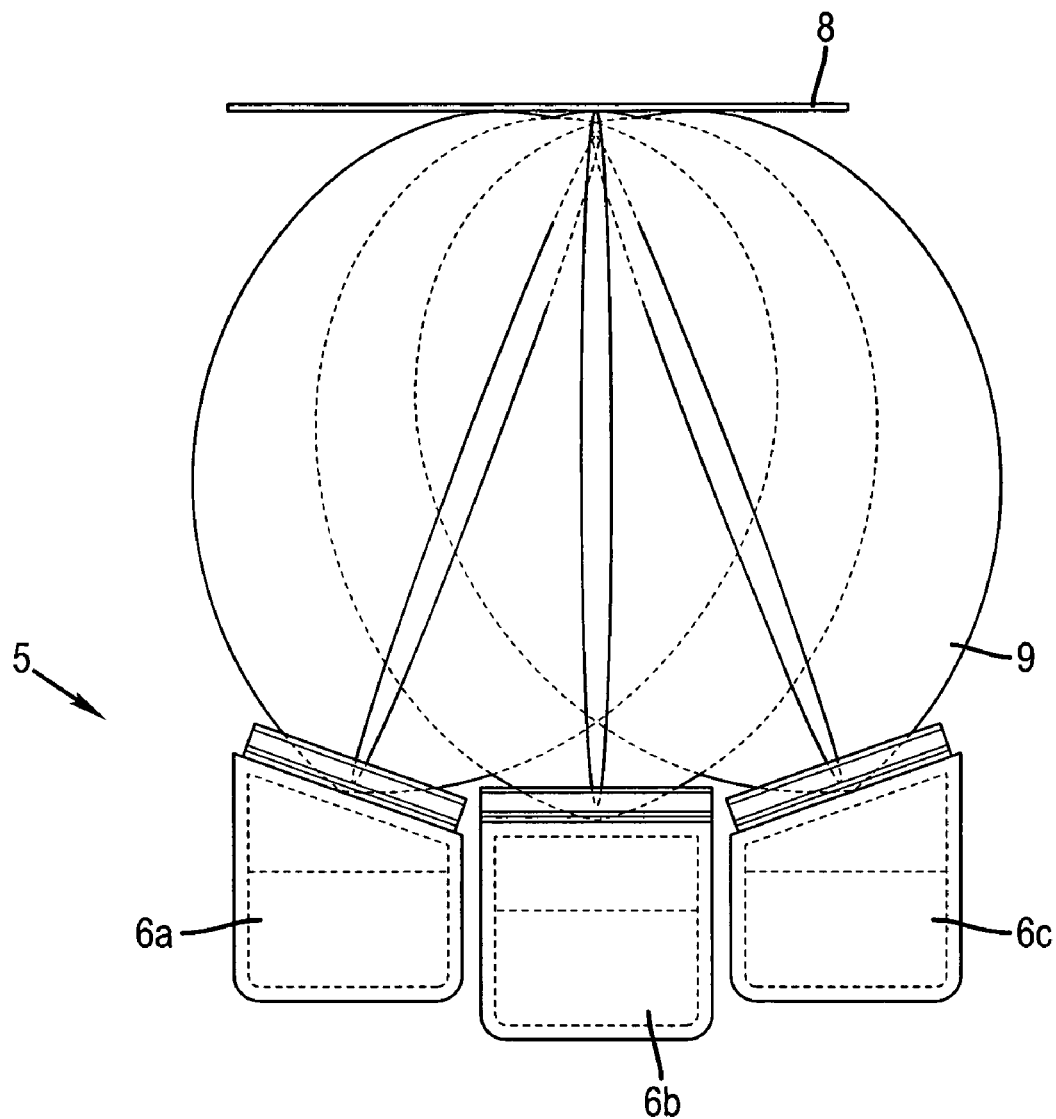
FIG. 1 shows a cross-sectional view of a prior-art vaporization device.
Figure 2:
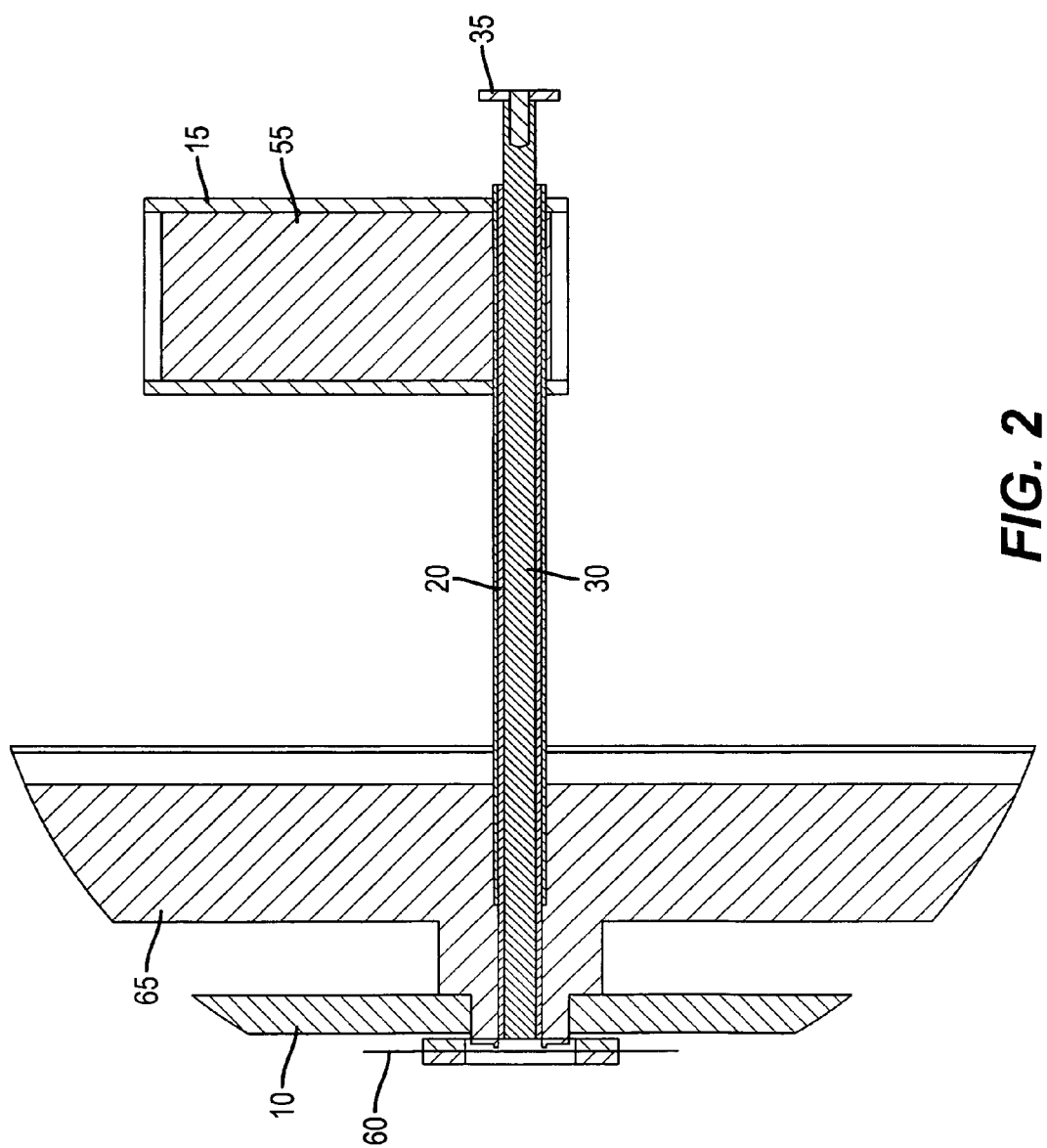
FIG. 2 is a cross-sectional view of one embodiment of a portion of an apparatus for feeding and vaporizing powder comprising multiple components.

Turning now to FIG. 2, there is shown a cross-sectional view of one embodiment of a portion of an apparatus for feeding and evaporating powdered organic materials comprising multiple components. Such an apparatus is a thermal physical vapor deposition source and has been described by Long et al. in above-cited U.S. patent application Ser. Nos. 10/945,940 and 11/134,654. An auger structure 30 moves organic material 55 from a feed vessel 15 along a feeding path 20 into a manifold 10 and a heating element 60, which can be e.g. a heated screen. A base 65 is a heat-dissipating structure to prevent much of the heat from heating element 60 from traversing the length of feeding path 20, and thus keeps the bulk of the organic material significantly cooler than the conditions it experiences in the vaporization zone immediately adjacent to heating element 60. Manifold 10 includes a vaporization zone which is defined as the region of feeding path 20 immediately adjacent to heating element 60. A thin cross-section of organic material powder is heated to the desired rate-dependent temperature, which is the temperature of heating element 60, by virtue of contact and thermal conduction, whereby the thin cross-section of organic material powder vaporizes to be delivered to a substrate surface to form a layer. The structure of auger structure 30 and the rotation rate provided by a motor 35 control the rate at which organic material 55 is fed to heating element 60. This linearly controls the rate of vaporization and therefore the rate at which vaporized organic material leaves the manifold. Thus the feed rate of the organic material to the auger structure and to the vaporization zone controls the deposition rate of the vaporized organic material onto the desired surface. While the organic material can comprise a single component, this apparatus is most useful for vaporizing materials that comprise two or more different organic material components, each one having a different vaporization temperature. However, a deficiency of this apparatus is that it does not provide for removing contaminants from the organic material before vaporization. A wide range of sublimation temperature materials mixed together can be employed in a flash sublimation-type source, however, the need to remove contaminants from the materials before sublimation is critical.

Figure 3:
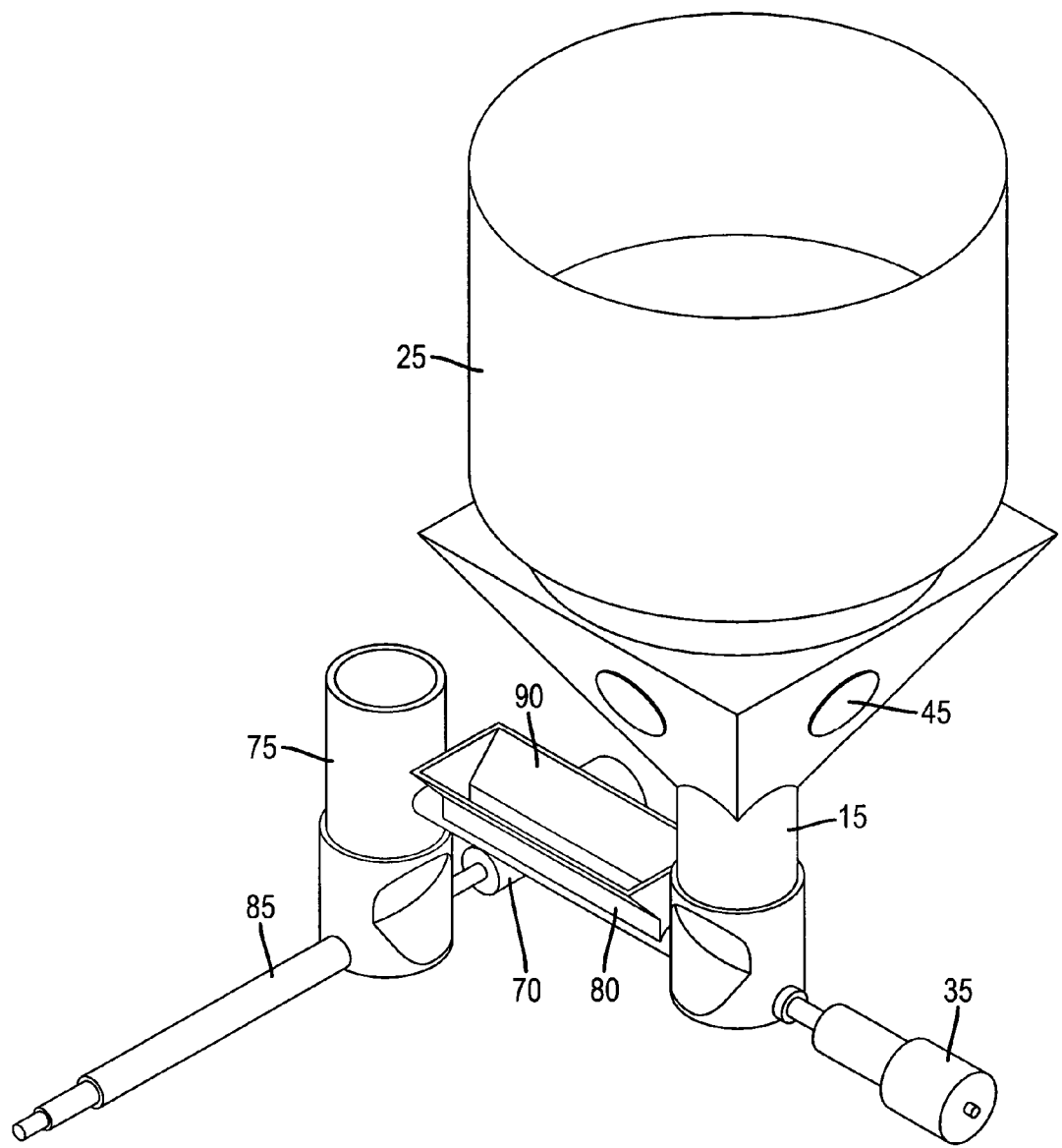
FIG. 3 is a three-dimensional view of a portion of another embodiment of an apparatus for vaporizing organic materials and condensing them onto a surface to form a layer.

Turning now to FIG. 3, there is shown a three-dimensional view of a portion of another embodiment of a portion of an apparatus according to Long et al. for evaporating organic materials and condensing them onto a surface to form a layer, including an apparatus to drive off adsorbed gasses or impurities. The apparatus includes feed vessel 15 for holding a quantity of organic material. The apparatus can also include a reservoir vessel 25 for holding a reserve quantity of organic material that can be fed to feed vessel 15. The apparatus can also include agitating devices such as a piezoelectric structure 45 to facilitate the movement of organic material from reservoir vessel 25 to feed vessel 15. Organic material from feed vessel 15 is fed into a first feeding path 80. First feeding path 80 includes an auger structure for moving the organic material from feed vessel 15 to first feeding path 80. At least a portion of the auger structure is turned by motor 35 to feed organic material powder along first feeding path 80. First feeding path 80 includes a vacuum exposure opening 90, which is in communication with a source of partial vacuum. First feeding path 80 can be heated so as to heat the organic material while exposing it to a partial vacuum. This step can drive off adsorbed gasses or impurities as the organic material is moved along first feeding path 80 to the vaporization zone. For typical deposition rates, the free powder has several minutes to liberate adsorbed water vapor and gas molecules just prior to being compacted and vaporized. The organic material is then transferred to a second feeding path 85, which is defined by an auger structure as described above, in which it is consolidated, that is, it is compacted and evenly distributed around the auger structure. Organic material powder is fed along second feeding path 85 by the auger structure to a manifold and vaporization zone (not shown) as described above, where the organic material is vaporized and subsequently condensed onto the surface of an OLED substrate to form an organic layer. At least a portion of the auger structure is turned by a motor 70 to feed organic material powder along second feeding path 85. An optional second feed vessel 75 can receive the exposed organic powder from first feeding path 80. In such a case, the auger structure that defines second feeding path 85 is also associated with feed vessel 75 for feeding exposed powder to second feeding path 85, and such auger structure passes through the interior of feed vessel 75. This apparatus also includes means for fluidizing the organic material powder.

A deficiency of this apparatus is that some component mixtures may not be thoroughly decontaminated via vacuum exposure opening 90. Consider, for example, a mixture comprising two materials, A and B, in a predetermined ratio. Components A and B display a large difference in sublimation temperature (greater than 40° C. difference), wherein component A has the higher sublimation temperature. If component A has a volatile contaminant C, whose vaporization temperature is at or above the sublimation temperature of component B, an attempt to remove this contaminant in the above apparatus will also lead to some or all of component B being vaporized. Thus, the ratio of components A and B will change, leading to a non-optimum device being prepared. An example of this can be a host/dopant mixture. A dopant may need only moisture removed while the host may need removal of moisture and a low-molecular weight contaminant. But the low molecular weight contaminant can have a different sublimation temperature incompatible with other materials so that they cannot be easily processed together. Hence, purifying off site before mixing has an advantage.

Figure 4:
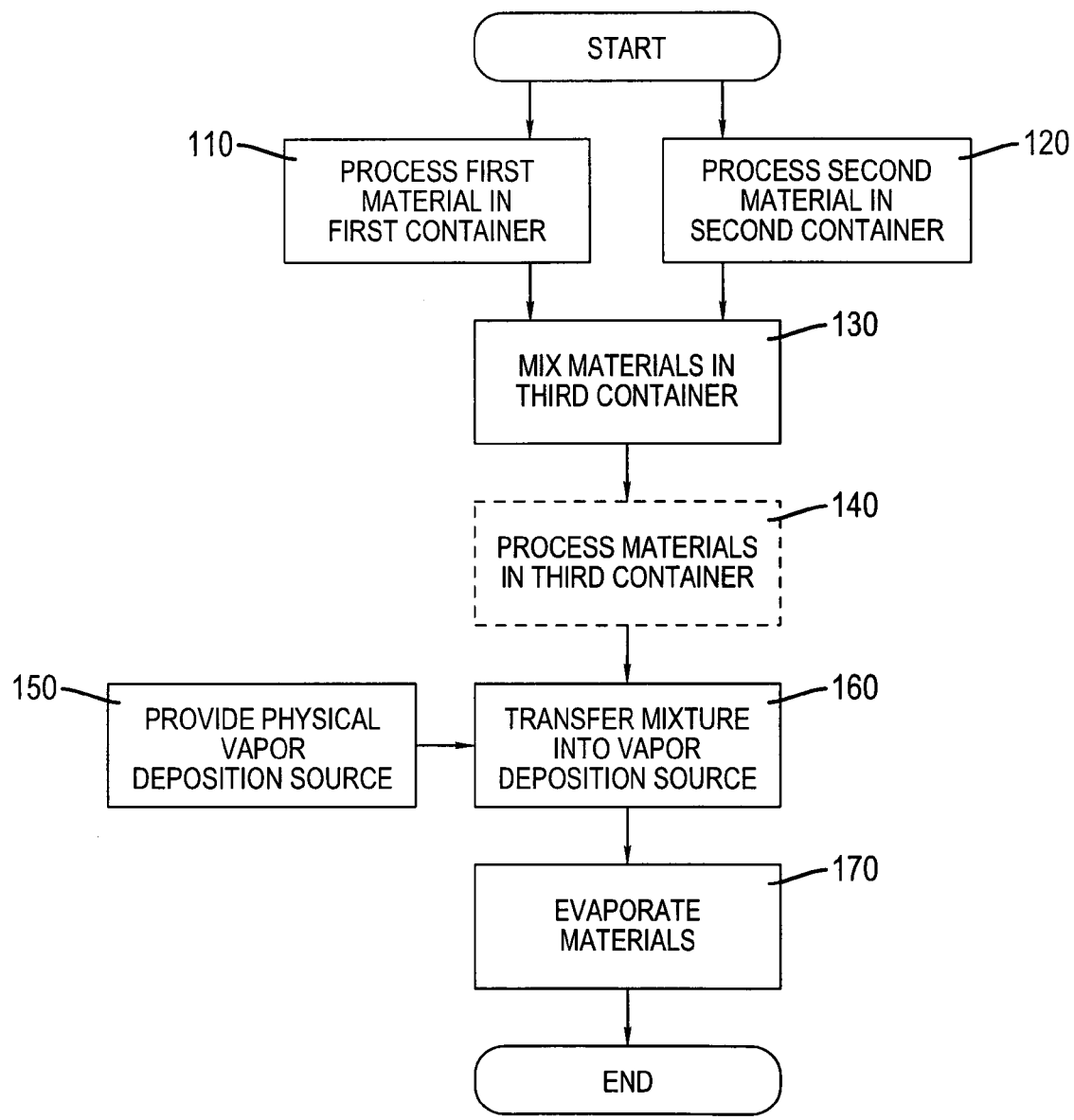
FIG. 4 shows a schematic flowchart of an embodiment of the present invention.

Referring to FIG. 4, a schematic flow chart illustrates a method according to this invention for evaporating a plurality of purified organic materials in a thermal physical vapor deposition system, comprising the steps of processing a first organic material in a first container to remove first contaminants (Step 110); processing a second organic material in a second container to remove second contaminants (Step 120); mixing predetermined amounts of at least the first and second purified organic materials in a third container to form a mixture of organic materials at a predetermined ratio (Step 130); providing a physical vapor deposition source (Step 150); transferring the mixture of organic materials into the thermal physical vapor deposition source (Step 160); and evaporating the purified mixture of organic materials (Step 170). In an alternative embodiment, the mixture of materials in the third container can optionally be processed to remove contaminants (Step 140). In further embodiments of the present invention, additional organic materials can be employed, optionally processed in additional containers to remove contaminants, and mixed in the third container to form a mixture of materials at various predetermined ratios. The resulting mixture can then be transferred into a thermal physical vapor deposition source and evaporated. In various embodiments of the present invention, the first, second, and any additional organic materials can be powder materials. By processing the organic materials before they are mixed, and by mixing the materials before they are transferred into a single thermal vapor deposition source, the problems of the previous methods are mitigated. The organic materials are provided to the source in a highly purified state, and co-deposition occurs within a single source without the need of careful dynamic material ratio calibration.

Figure 5:
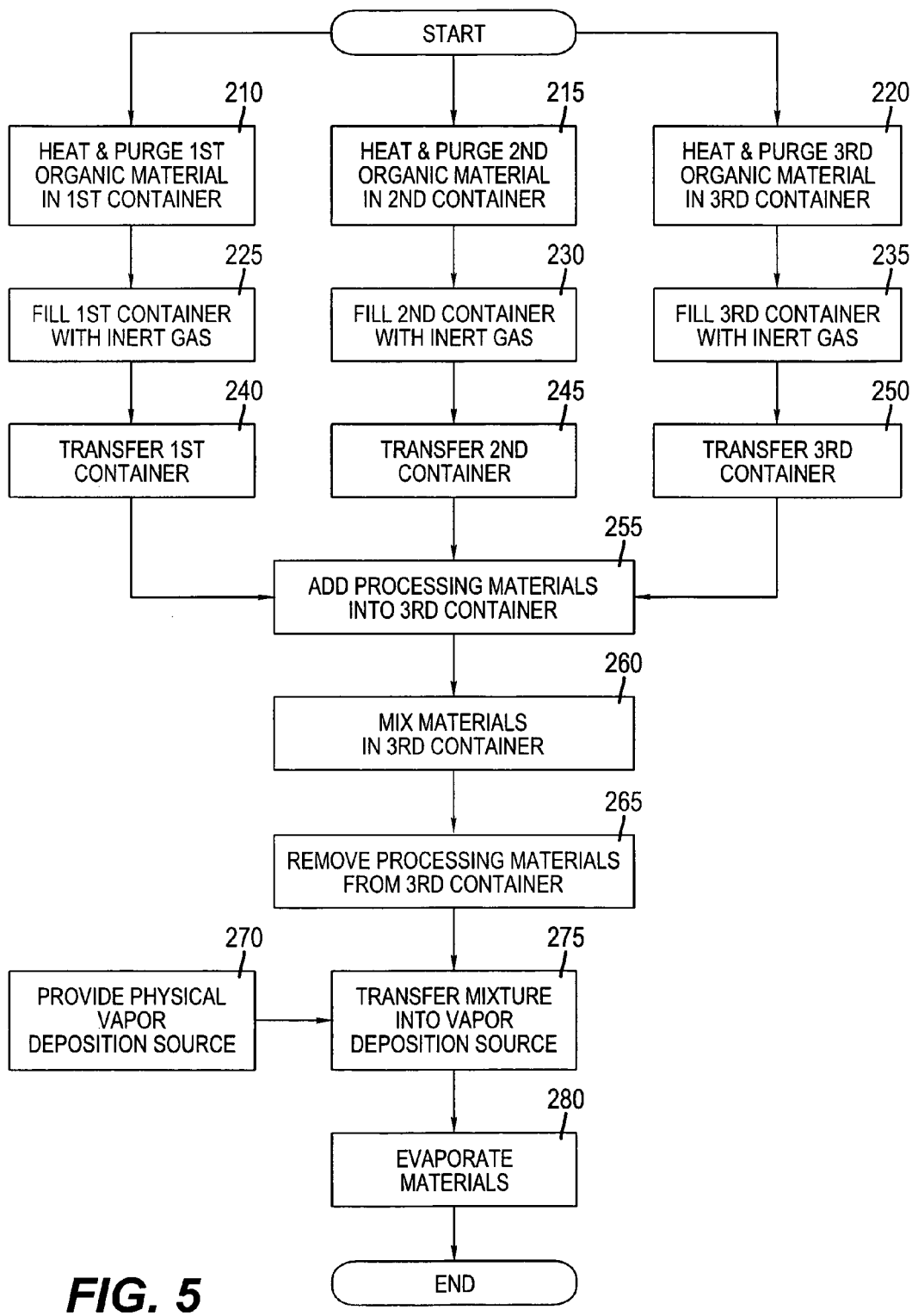
FIG. 5 shows an alternative schematic flowchart of an embodiment of the present invention.

Referring to FIG. 5, there is shown a more detailed embodiment of a method according to the present invention. A first organic material in a first container is heated and the container purged of any contaminants released in the heating process (Step 210). The heating is to a temperature less than the sublimation temperature of the first organic material. A second organic material in a second container can be likewise heated at a temperature less than its sublimation temperature and the container purged of any contaminants released in the heating process (Step 215). If a third organic material in a third container is desired, it too can be heated at a temperature less than its sublimation temperature and the container purged of any contaminants (Step 220). Purging can be done by evacuating the containers or by filling the first, second, or third containers with an inert gas (Steps 225, 230, 235). This can be done in separate steps as shown, or in combined steps, e.g. Steps 210 and 225 can be combined into a single step. These steps represent one embodiment of processing organic materials to remove contaminants.

A variety of processes can be used in accordance with the present invention to remove contaminants from the organic materials, resulting in purified organic materials. Processing can include heating, vacuum treatment, or atmospheric purging, or combinations of these techniques. For example, the container having organic material can be placed in a vacuum furnace, then heated in a range of temperatures from 40 to 200° C., but below the sublimation temperature of the organic material, for 30 to 100 minutes while purging the atmosphere to a pressure of $10^{-1}$ to $10^{-3}$ Torr in order to reduce the moisture content of the powdered organic materials. It is important to remove the moisture from the powdered organic materials in order to facilitate mixing and maintain a consistent chemical composition. The final mixture of powdered organic materials can be stored in a reduced pressure atmosphere of $10^{-1}$ to $10^{-3}$ Torr, until mixing.

Figure 10A:
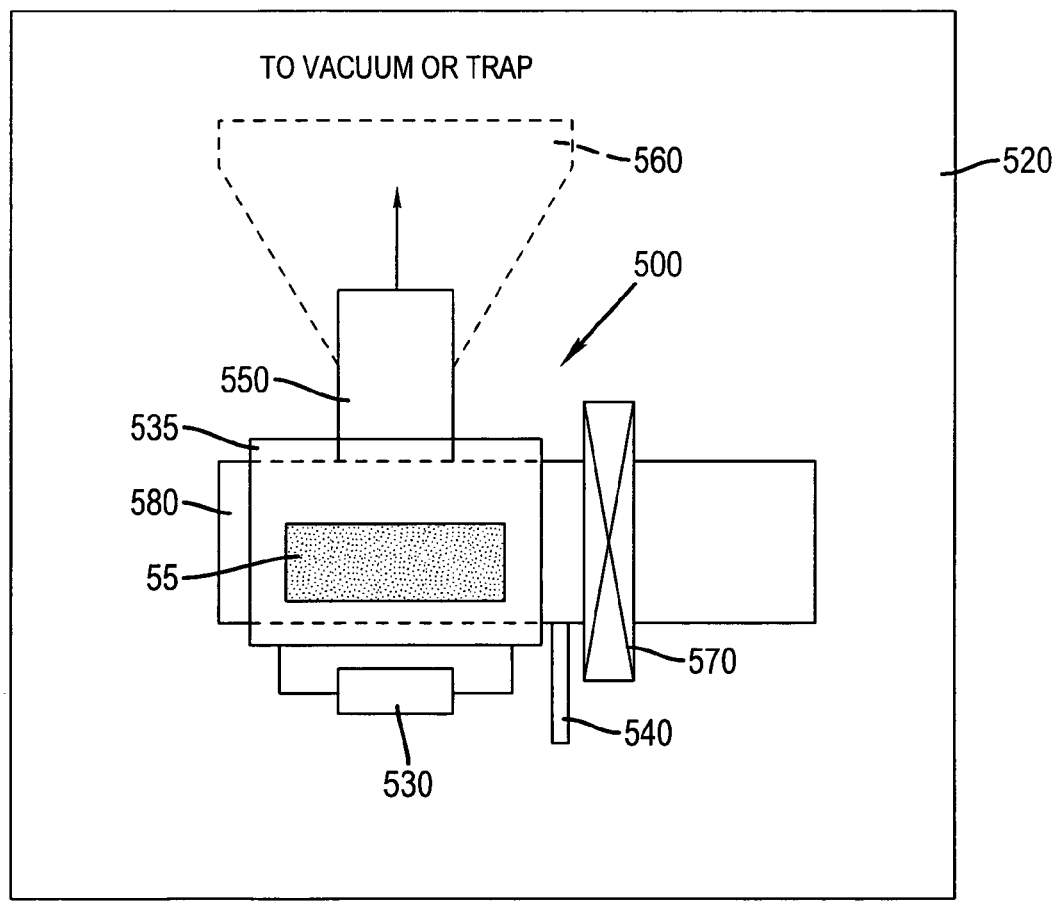
FIGS. 10a to 10c shows several embodiments of an apparatus to perform the processing described herein.
Figure 10B:
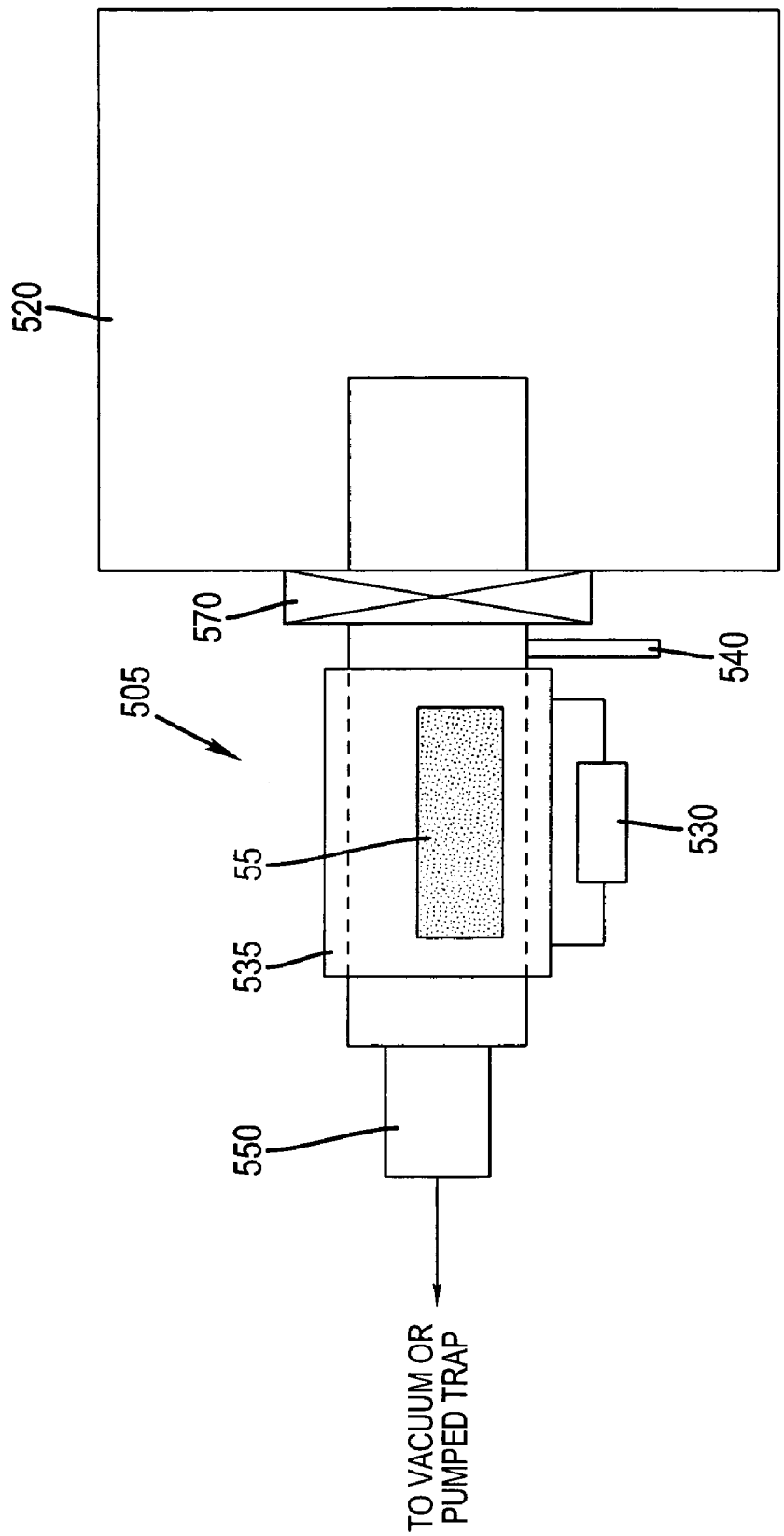
Figure 10C:
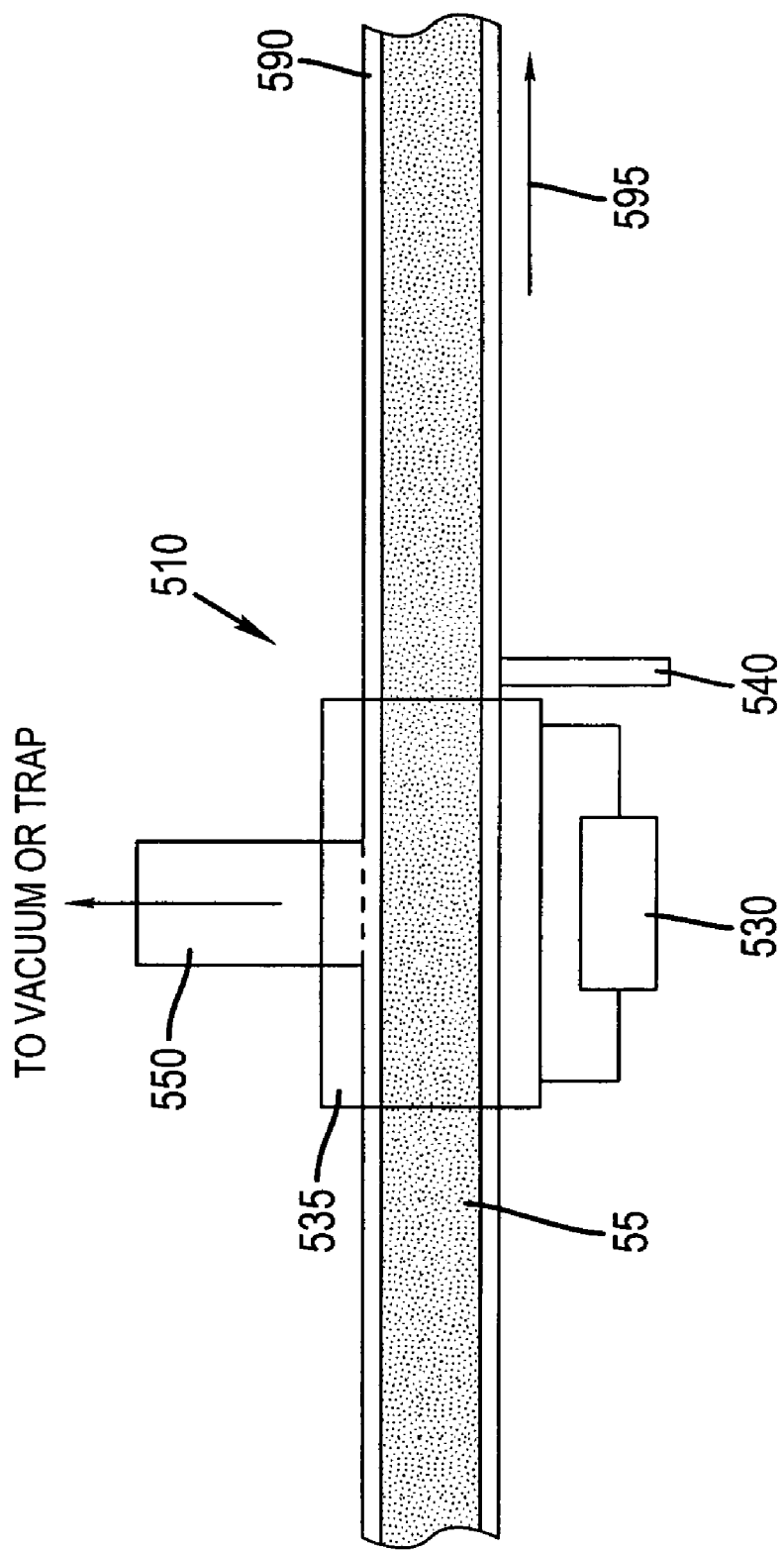

Referring to FIG. 10a to 10c, there are shown several embodiments of an apparatus to perform the processing of organic materials as described herein. FIG. 10a shows a processing apparatus 500 that can be incorporated in the interior of a chamber 520 and used to process organic material on a batch basis. Processing apparatus 520 includes a heater 535 controlled by a heater supply 530, a purge gas inlet 540, and an outlet 550 for removing vapor. It can also optionally include a vacuum baffle 560. A charge of organic material 55 can be placed into heater 535 via load port 580 and then treated with heat, vacuum, or a purging gas such as nitrogen, or any combination of these. The processed organic material can then be removed via gate valve 570 to be mixed with other organic material (if necessary) and vaporized onto a substrate. One advantage of processing apparatus 500 is that if chamber 520 is a vacuum chamber, the vacuum is already provided, requiring only some form of trap (e.g. a cold trap) to prevent the removed contaminants from contaminating chamber 520 or the vacuum pump. FIG. 10b shows a similar processing apparatus 505 that is located outside of chamber 520, and thus must have a separate vacuum connection, but otherwise operates similarly to processing apparatus 500. FIG. 10c shows a processing apparatus 510 that can be used to process organic material 55 on a continuous basis. Organic material 55 moves continuously through delivery tube 590 in direction of flow 595, e.g. by any of the methods described by Long et al. in above-cited U.S. patent application Ser. Nos. 10/945,940 and 11/134,654, and moves through heater 535 while being treated with purging gas that is delivered via purge gas inlet 540. The purging gas can be removed with volatilized contaminants via outlet 550, which can be connected to a vacuum.

It is not necessary that the organic material processing, for example heating and purging, be done at the same location as the later mixing step. It can be preferred, for example, to process or mix the organic materials in a remote location and to transfer the containers to a location near a vapor deposition source (FIG. 5, Steps 240, 245, 250). Preferably, however, the processing is done just prior to mixing so as to preclude the likelihood of recontaminating the organic material or of organic material destabilization. Hence, any transfer step should be minimized. Likewise, the containers with organic materials can be stored before, during, or after processing, transfer, or mixing, but such storage times should be minimized where possible. It is preferred that the transferring of the purified mixture of organic materials be done in less than 60 minutes from the time that the organic material is processed.

Figure 6:
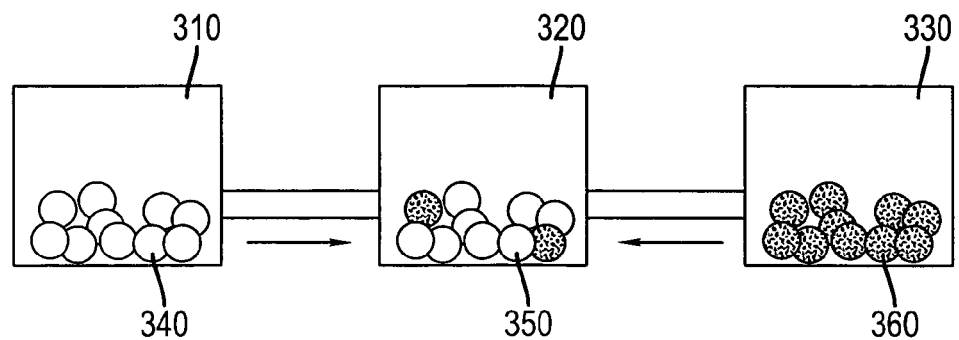
FIG. 6 shows a cross-sectional view of an embodiment of an apparatus useful for the method of the present invention.
Figure 7:
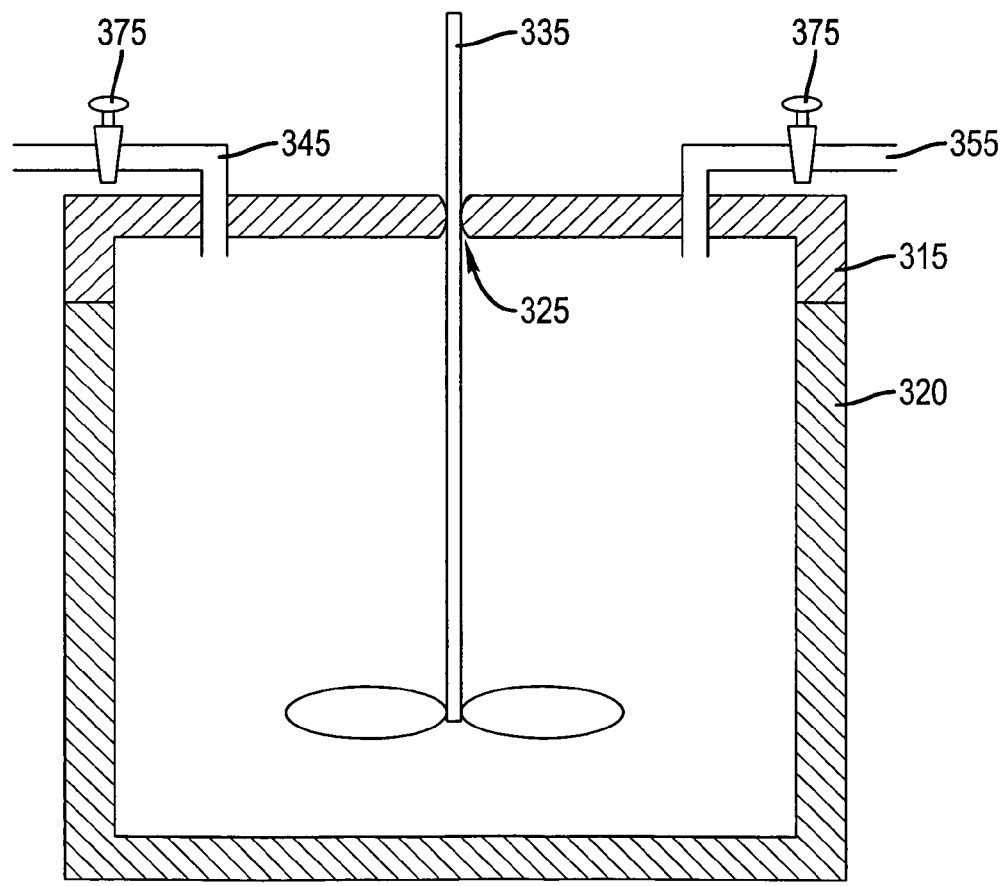
FIG. 7 shows a cross-sectional view of a container useful for the method of the present invention.

The first, second, and any additional organic materials can be mixed in a separate container or, alternatively, they can be added to one of the containers in which the organic materials are first processed, and mixed in that container (FIG. 5, Step 260). The containers can be formed from glass, metal, ceramic, plastic, or combinations of these materials, and can employ a variety of shapes. If the container is transparent, the mixing process can be monitored visually. Referring to FIG. 6, a first container 310 and a second container 330 containing a first organic material 340 and a second organic material 360, respectively, are connected to a third container 320, also called the mixing container, wherein the different organic materials will be mixed to form mixed organic material 350. In this embodiment, first organic material 340 or second organic material 350, or both, are processed before mixing in third container 320. Referring to FIG. 7, there is shown a more detailed view of one embodiment of the mixing container as made ready for the mixing step in accordance with this invention. Third container 320 is sealed using a container cover 315 having at least one sealable opening 325 that allows a propeller 335 or turbine blade to pass through, while the sealable opening also functions as an airtight seal. The container is equipped with two pressure control devices. One intake pressure control device 345 can have a flow valve and a release valve for providing an inert atmosphere in the container, though for simplicity only a single valve 375 is shown. An outtake pressure control device 355 can have a flow valve and a release valve for removing moisture and other contaminants from the container. The second pressure control device 355 is coupled to a vacuum pump (not shown) that is capable of providing a negative pressure gradient in order to purge the atmosphere from the container, which can be replaced with an inert atmosphere before mixing. After sealing the container, the atmosphere can be evacuated from the container and the container can be filled with an inert atmosphere such as nitrogen, argon or a mixture thereof. The inert atmosphere provides a dry controlled contaminant-free environment to avoid the introduction of water or other contaminants. Alternatively, the mixing can be done under reduced pressure (vacuum). Processing the organic material can include processing mixed organic material 350 to remove contaminants, provided that such contaminants can be removed at a temperature lower than the sublimation temperatures of any of the organic material components. The detailed structure of third container 320 as shown in FIG. 7 allows processing with vacuum or inert atmosphere flushing. Third container 320 can also be heated as part of the processing.

It is important that the organic materials of the present invention be well and uniformly mixed in Step 260 (FIG. 5) for subsequent evaporation to a suitable organic layer on an OLED substrate. A variety of means can be provided for mixing the organic materials. Mixing can be accomplished by propeller mixing, wherein a propeller 335 or turbine blade is used to mix the mixture of powdered organic materials to form the mixture of powdered organic materials. A motor can rotate the propeller, which can include a first rotatable shaft, at a rate of 20,000 to 50,000 revolutions per minute. The motor can be mounted on a traversing bracket, which in turn is fixed to a base plate. A pneumatic cylinder can move the traversing bracket in a reciprocating motion so that the mixing mechanism can traverse from one end of the container to the other during the mixing process, e.g. at a rate of 30 to 60 cycles per minute. A second rotatable shaft coupled to the container can be driven by an electric motor via a belt and pulley arrangement. The electric motor can thus rotate the container, e.g. at a rate of 10 to 60 revolutions per minute. The container can be rotated in a direction opposite to or the same as that of the first rotatable shaft and the mixing mechanism. The first rotatable shaft and the second rotatable shaft are coupled with plain bearings that are supported by a bearing support.

Alternatively, ultrasonic mixing can be completed using an ultrasonic horn. Likewise, the mixing can be performed by a variety of mechanical tools, e.g. magnetic stirrers or gas jets.

In general, the mixture of organic materials is formed in a predetermined ratio, established by the specifications of the organic layer formed when the materials are deposited on a surface by the thermal physical vapor deposition source, by mixing predetermined amounts of the first, second, and any other organic materials. The predetermined ratio can result in a percent by weight of either the first or second organic material between 0.1 and 49.995% by weight of the mixture. Such materials can comprise a host and dopant to form an OLED light-emitting layer. Powdered organic materials used as a host component in the present invention can include Alq3, NPB and TBADN. Examples of some powdered organic materials used as dopant components in this invention are DCJTP, Rubrene, OP31, DPQA and DBzR. Other organic materials for light-emitting layers have been well described in the art.

The first and second organic materials, when mixed, typically do not chemically interact but instead form a powder having two separate constituent components. It is also possible to cause the two organic materials to combine as is described, for example, in above-cited U.S. patent application Ser. No. 10/663,636 which is incorporated herein by reference. This method includes combining organic materials having at least one dopant component and one host component to form a mixture of organic materials and placing the mixture of organic materials in a container and sealing the container. The method further includes heating and mixing the organic materials until they are melted to form a mixture of organic materials, then solidifying the mixture of organic materials and removing the solidified mixture of organic materials from the container. The solidified material can be used as is or further processed, for example by pulverizing.

Optionally, as an aid to facilitate mixing or to provide further processing to the organic materials, additional processing materials can be added to the organic material mixture (FIG. 5, Step 255) just prior to, during, or after mixing step 260 (FIG. 5). These added materials can aid the mixing process to improve, for example, the uniformity of the mix or to further process any one of the materials or the mixed materials, for example by removing contaminants or unwanted byproducts. For example, a liquid can be employed as a processing material to disperse the organic materials or to dissolve impurities in the organic materials, producing a slurry of organic materials. The dispersing liquid can be e.g. isopropyl alcohol or distilled water, and can be employed with the first or second organic material, or with the mixture thereof. The dispersed first and second organic materials in the first, second, or third container can then be mixed to form a well-mixed mixture of organic material. The liquid can be removed from the organic materials or mixture after processing by e.g. evaporation, filtration, or centrifugation, leaving a purified mixture of organic materials. Alternatively, the mixing can include providing a solvent with the first and second organic materials to form a suspension of organic materials in the solvent; the suspension can be mixed at a temperature sufficient to form a solution of the first and second organic materials in the solvent, and then the solvent can be evaporated from the solution leaving a purified mixture of organic materials.

Desiccants or organic absorbents, for example activated carbon, or a reactive material such as lithium can be employed as additional processing materials to enhance the mix of organic materials. The processing materials can be deposited on the inside of the container, thereby exposing the processing materials to the organic materials without mixing the processing and organic materials or contaminating the organic materials.

If a ball milling process is employed, it is generally done by first adding a liquid medium. Ceramic ball media are also added as processing materials to the container with the organic powder mixture and the dispersing liquid, and the container is sealed. The container is placed in e.g. a three-axis ball mill mixer and allowed to mix for a sufficient time until a mixture of organic slurry is obtained. The container can then be removed from the ball mill mixer and the ceramic ball media separated from the organic slurry mixture. If pulverizing is required, any conventional pulverizing technique that maintains the purity of the materials can be employed, for example a second stage ball mill process. The liquid medium can be removed by known methods, e.g. as described above for solvents.

If processing materials are employed in the mixing step and are not destroyed or used during the mixing process, the processing materials can be removed from the organic materials or mixture (FIG. 5, Step 265) after processing, and before the mixture is transferred and evaporated. For example, ceramic balls from a ball mill mixer can be removed by screening. Liquid processing materials can be removed from the organic materials by filtration or evaporation. The final steps of FIG. 5 (Steps 270, 275, and 280) are similar to the final steps (Steps 150, 160, and 170) of FIG. 4. A thermal physical vapor deposition source, e.g. that of FIG. 2, is provided. The purified mixture of organic materials is transferred into the source, e.g. into feed vessel 15 of FIG. 2. In some embodiments, the mixing container and the feed vessel can be the same. The organic materials are transferred to the actual evaporation site, e.g. heating element 60 of FIG. 2, and evaporated.

In transferring the purified mixture of organic material into the thermal physical vapor deposition source, it is important to maintain the purified mixture in a controlled, contaminant-free environment, so as to prevent the recontamination of the purified materials. This can be provided by maintaining the environment in a dry state, under reduced pressure, or at an elevated temperature lower than 200° C., or some combination of these conditions. There are a number of ways to accomplish this. For example, the processing, mixing, and transfer of organic materials can be done entirely in a larger controlled-environment chamber, e.g. a dry box or a vacuum oven. Alternatively, the interior of a container such as container 320 of FIG. 7 can be maintained as a controlled environment, and container 320 can be used as a transfer container as well as a mixing container.

A variety of equipment can be employed with the present invention. The thermal physical vapor deposition source can be part of a continuous system and the mixing container coupled to the thermal physical vapor deposition source for transferring the mixture of organic materials. Above-cited U.S. patent application Ser. No. 11/050,924 which is incorporated herein by reference describes a method for metering powdered or granular material onto a heated surface to vaporize the material. It provides for a container with powdered or granular material having at least one component, and a rotatable auger in a material-receiving relationship with the container for receiving the organic material. As the auger rotates, it translates the organic material along a feed path to a feeding location. The pressure produced by the rotating auger on an opening at the feeding location causes the organic material to be forced through the opening onto the heated surface in a controllable manner. Such a device is suitable for employment with the method of the present invention.

Figure 8:
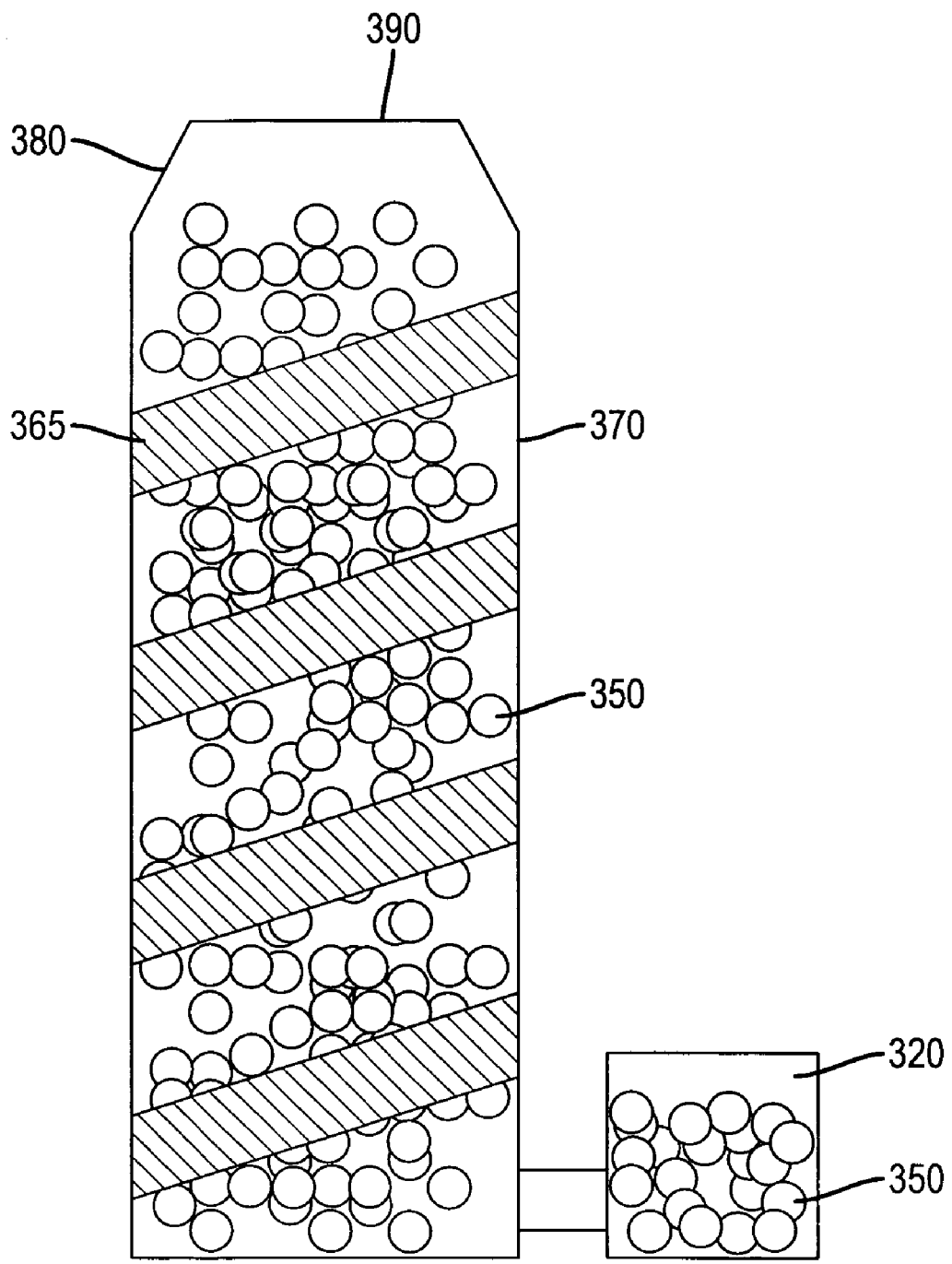
FIG. 8 shows a cross-sectional view of an embodiment of a physical vapor deposition system useful for the method of the present invention.

Referring to FIG. 8, a continuous thermal physical vapor deposition source 370 can employ an auger structure 365 and be physically attached to a container, e.g. third container 320 containing mixed organic material 350. Source 370 and container 320, along with any necessary mixing apparatus, comprise a thermal physical vapor deposition system wherein the source evaporates a purified mixture of organic materials. Purified mixture of organic materials 350 is transferred into thermal physical vapor deposition source 370, wherein the transferring can be a continuous transfer. As the auger turns, mixed organic material 350 is forced into vaporization manifold 380, pressed against a heating element 390, and evaporated. Holes in heating element 390 allow egress of the evaporated materials, which are then sublimed onto a substrate (not shown). Such a system is especially useful for continuous processes in which substrates pass by vaporization device 370. Layer deposition rate can be controlled by metering the rate of organic material vaporization. Container 320 can have the elements shown in detail in FIG. 7. In such a case, mixed organic material can be processed in a container physically attached to thermal physical vapor deposition source 370.

Figure 9:
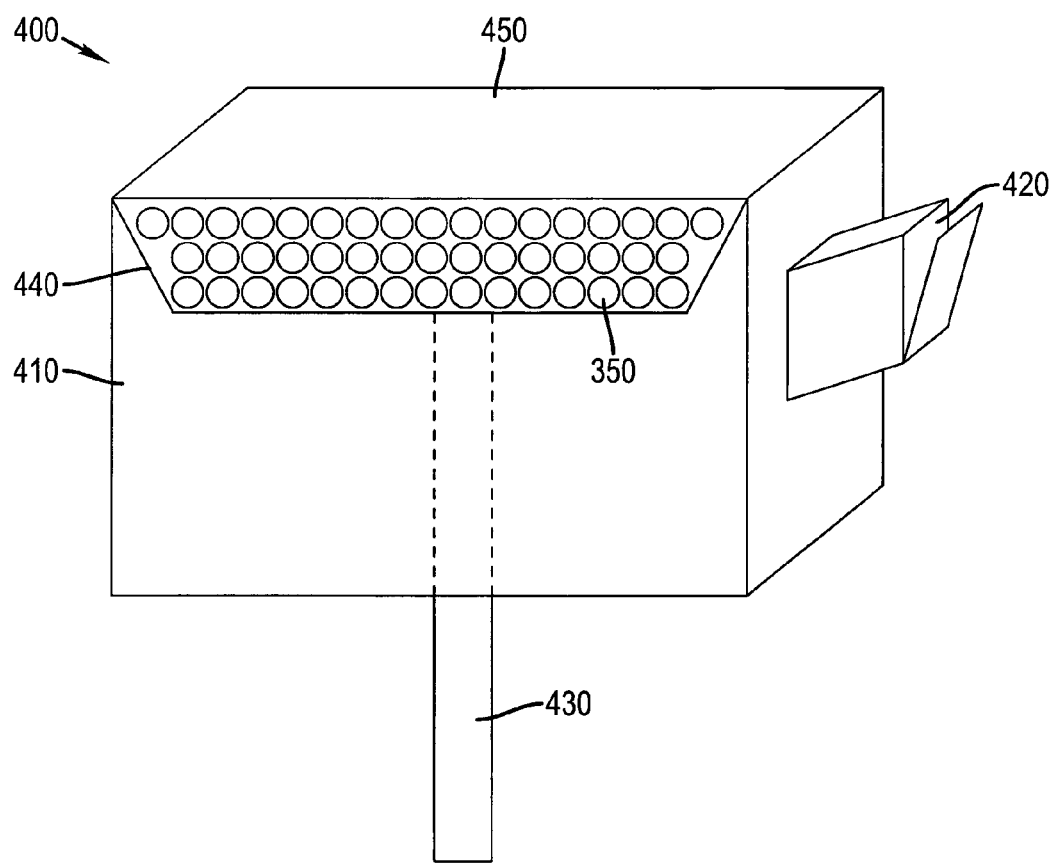
FIG. 9 shows a perspective view of an alternative embodiment of a physical vapor deposition system useful for the method of the present invention.

Alternatively, batch thermal physical vapor deposition systems can be employed wherein the mixing container is coupled to the thermal physical vapor deposition source for transferring the mixture of organic materials. Referring to FIG. 9, the processing described herein can be done in a container (not shown) remote from thermal physical vapor deposition source 400 and physically detached from it. The container can then be coupled to thermal physical vapor deposition source 400 through a port 420 to transfer mixed organic material 350 into a tray 440. This can facilitate the transfer of organic material using a controlled-environment container as described above, wherein the transferring of the purified mixture is a batch transfer. The organic material can be pressed against heating element 450 by a piston 430 moving in a chamber 410 such that heating element 450 evaporates the top layer of organic material. Such a batch system is especially useful for batch processes in which substrates are located at rest near thermal physical vapor deposition source 400. Layer deposition rate can be controlled by metering the amount of organic materials supplied to heating element 450.

A variety of embodiments can be employed within the present invention. For example, either the first or the second organic materials, or both, can be processed immediately prior to mixing. The mixing of the first and the second organic materials can be done immediately prior to transferring. A third organic material can be processed in a fourth container to remove third contaminants and the third organic material mixed at a predetermined ratio with the first and second materials in the first, second, third or fourth container. The organic material can be processed after mixing to remove contaminants. To aid in transfer or storage, one or more of the containers can be heated, filled with inert or dry gases, or maintained at a reduced pressure when containing powdered organic materials. In many of these embodiments, containers can be reused or used for multiple purposes, for example, the first, second or third containers can be the mixing container.

The present invention thus provides a lower-cost and a more efficient utilization of materials in the manufacture of OLED devices.

The invention has been described in detail with particular reference to certain preferred embodiments thereof, but it will be understood that variations and modifications can be effected within the spirit and scope of the invention.

PARTS LIST 5 vaporization device
6a source
6b source
6c source
8 substrate
9 vapor plume
10 manifold
15 feed vessel
20 feeding path
25 reservoir vessel
30 auger structure
35 motor
45 piezoelectric structure
55 organic material
60 heating element
65 base
70 motor
75 feed vessel
80 first feeding path
85 second feeding path
90 vacuum exposure opening
110 block
120 block
130 block
140 block
150 block
160 block
170 block
210 block
215 block
220 block
225 block
230 block
235 block
240 block
245 block
250 block
255 block
260 block
265 block
270 block 275 block
280 block
310 first container
315 container cover
320 third container
325 sealable opening
330 second container
335 propeller
340 first organic material
345 pressure control device
350 mixed organic material
355 pressure control device
360 second organic material
365 auger structure
370 thermal physical vapor deposition source
375 valve
380 vaporization manifold
390 heating element
400 thermal physical vapor deposition source
410 chamber
420 port
430 piston
440 tray
450 heating element
500 processing apparatus
505 processing apparatus
510 processing apparatus
520 chamber
530 heater supply
535 heater
540 purge gas inlet
550 outlet
560 vacuum baffle
570 gate valve
580 load port
590 delivery tube
595 direction of flow

The invention claimed is:

1. A method for evaporating a plurality of purified organic materials in a thermal physical vapor deposition system, comprising the steps of:
   a) mixing predetermined amounts of first and second organic materials to form a mixture of materials at a predetermined ratio;
   b) processing the mixture of materials at less than the sublimation temperature of either of the first or second organic materials to purify the mixture by removing a first contaminant by sublimation;
   c) providing a thermal physical vapor deposition source;
   d) transferring the purified mixture of organic materials into the thermal physical vapor deposition source while maintaining the purified mixture of organic materials in a controlled, contaminant-free environment; and
   e) using the source to evaporate the purified mixture of organic materials.

2. The method of claim 1 wherein the organic materials are powder materials.

3. The method of claim 1 wherein the processing includes heating.

4. The method of claim 3 wherein the heating is in a range of temperatures from 40 to 200° C.

5. The method of claim 3 wherein the heating is for 30 to 100 minutes.

6. The method of claim 1 wherein the predetermined ratio results in a percent by weight of either the first or second organic material is between 0.1 and 49.995% by weight of the total weight of the mixture.

7. The method of claim 1 wherein the transferring of the purified mixture is a continuous transfer.

8. The method of claim 1 wherein the transferring of the purified mixture is a batch transfer.

9. The method of claim 1 further comprising the step of adding a processing material to the first or second organic materials or the mixture to process the organic materials or the mixture.

10. The method of claim 9 wherein the processing material is added to the organic materials or to the mixture to process the organic materials or mixture and the processing material is removed from the organic materials or mixture after processing.

11. The method of claim 9 wherein the processing material includes a desiccant, an organic absorbent, or a reactive material.

12. The method of claim 1 wherein maintaining the purified mixture of organic materials in a controlled, contaminant-free environment includes one or more of the following: maintaining the environment in a dry state or at a temperature lower than 200 C.

13. The method of claim 1 wherein transferring is done in less than 60 minutes from the time that the organic material is processed.

14. The method of claim 1 wherein processing is done in a container physically attached to the thermal physical vapor deposition source.

15. The method of claim 1 wherein processing is done in a container remote from the thermal physical vapor deposition source and physically detached from it.

16. A method for evaporating a plurality of purified organic materials for an OLED display device, comprising the steps of:
   providing a plurality of containers including organic materials respectively;
   processing organic materials in each container at less than the sublimation temperature of the organic materials to remove first a contaminant;
   mixing the organic materials to form a mixture in a separate container;
   processing the mixture in a separate container at less than the sublimation temperature of any of the organic materials included in the mixture to remove a second contaminant;
   transferring the mixture into a vapor deposition source;
   evaporating the mixture into a substrate to from an OLED display device.

17. The method of claim 16, wherein the step of processing further comprises providing inert gas atmosphere to prevent water or other contamination by filling inert gas in the separate container.

* * * * *